(12) United States Patent
Makino et al.

(10) Patent No.: US 7,669,317 B2
(45) Date of Patent: Mar. 2, 2010

(54) METHOD FOR REVERSING A CHIP VERTICALLY

(75) Inventors: Yoichi Makino, Fukuoka (JP); Akira Kabeshita, Osaka (JP)

(73) Assignee: Panasonic Corporation, Osaka (JP)

( * ) Notice: Subject to any disclaimer, the term of this patent is extended or adjusted under 35 U.S.C. 154(b) by 628 days.

(21) Appl. No.: 11/464,230

(22) Filed: Aug. 14, 2006

(65) Prior Publication Data
US 2007/0039686 A1    Feb. 22, 2007

(30) Foreign Application Priority Data
Aug. 16, 2005    (JP) .............................. 2005-235764

(51) Int. Cl.
*H05K 3/30* (2006.01)
(52) U.S. Cl. .............................. 29/832; 29/739; 29/809; 29/833; 29/834; 156/249; 156/539
(58) Field of Classification Search .................... 29/832, 29/739, 809, 833, 834; 156/249, 539
See application file for complete search history.

(56) References Cited

U.S. PATENT DOCUMENTS 5,839,187 A    11/1998    Sato et al.
6,467,158 B1*  10/2002    Kiyomura et al. ............. 29/740
7,437,818 B2*  10/2008    Kabeshita et al. ............. 29/832

FOREIGN PATENT DOCUMENTS

JP    2003-092313 A    3/2003
JP    2003-282642    10/2003

OTHER PUBLICATIONS

Chinese Office Action.

* cited by examiner

*Primary Examiner*—Thiem Phan
(74) *Attorney, Agent, or Firm*—Pearne & Gordon LLP

(57) ABSTRACT

In a chip reversing method for holding and vertically reversing a chip placed by a bonding nozzle, the chip is held on a chip holding unit disposed in a reversing member and is vertically reversed by turning the reversing member downward on a reversal shaft. After the reversed chip was received by a chip receiving unit, this chip receiving unit is lowered to a retracted position to return the reversing member to an original position. In this state, the chip receiving unit is raised to position the chip at a height level L for a chip transferring action. As a result, the reversing member does not protrude to above the height level for the chip transfer thereby to interfere with another mechanism, so that the chip mounting actions can be made efficient.

3 Claims, 16 Drawing Sheets

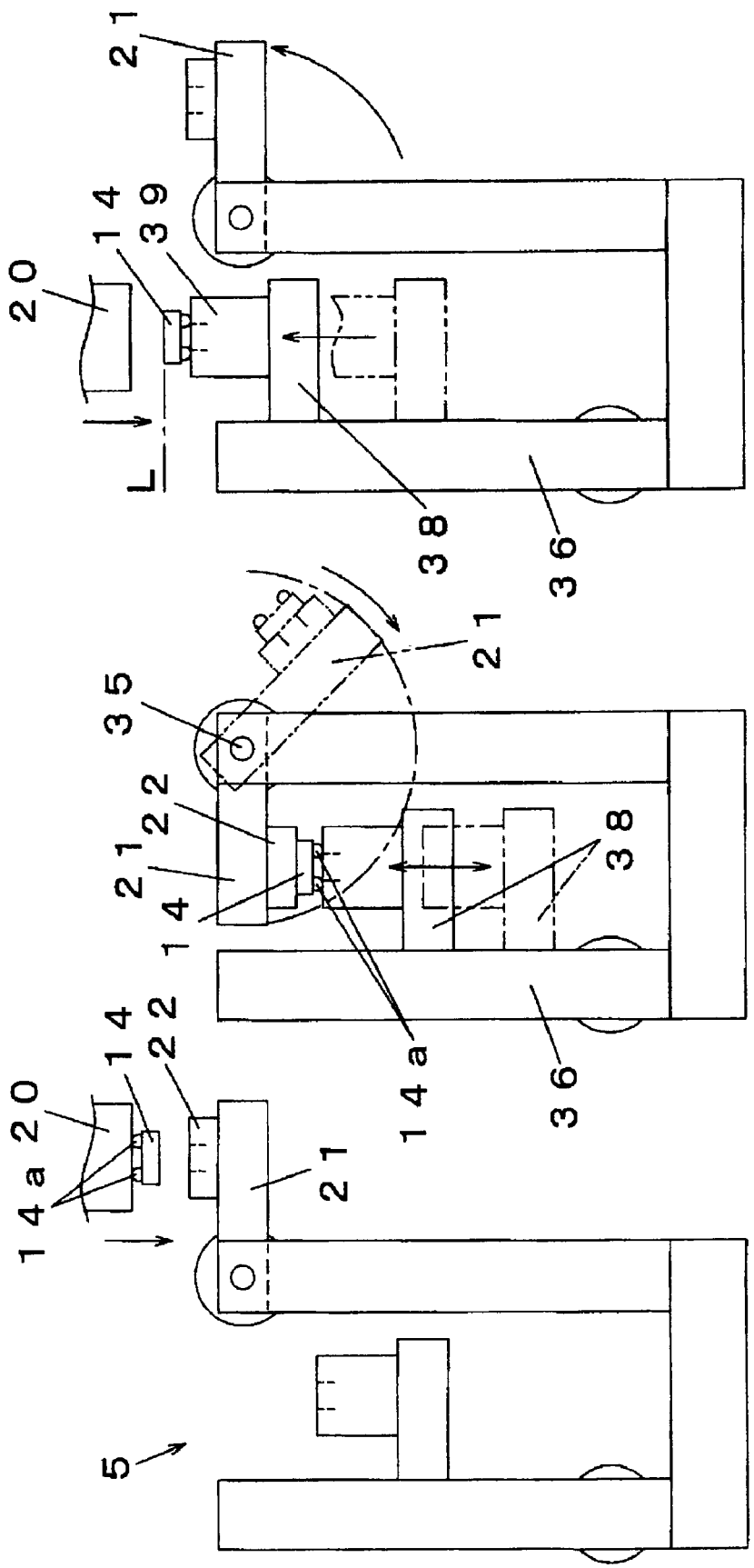

METHOD FOR REVERSING A CHIP VERTICALLY

CROSS-REFERENCE TO RELATED DOCUMENT

This application claims priority to JAPAN Patent Application No. 2005-235764, filed on Aug. 16, 2005.

BACKGROUND OF THE INVENTION

1. Field of the Invention

The present invention relates to a chip reversing device and a chip reversing method for reversing a chip, and a chip mounting apparatus and a chip mounting method for reversing and mounting a chip on a substrate.

2. Related Art

In a chip mounting apparatus for mounting chip parts such as semiconductor chips on a substrate, the mounting actions to hold the chip, as picked up from a chip feed unit, on a mounting head and to mount the picked-up chip on the substrate are repeatedly performed. The parts such as a flip chip, in which bumps or connecting protrusion electrodes are formed on one side face, are generally fed in the bump-formed faces positioned upward, and the chips, as picked up from the chip feed unit, are reversed up-side-down and are mounted on the substrate with the bump-formed face being directed downward. As this chip mounting apparatus for the parts needing the vertical inversions after picked up, there is known (as referred to JP-A-2003-282642) a chip mounting apparatus, which is provided with a reversing mechanism for reversing the plural parts as a whole and for transferring a flux to the bumps by reversing a holding head having the chips placed thereon, on a stage having a flux film formed thereon.

The aforementioned chip mounting apparatus of the prior art has adopted the constitution, in which the plural parts are held on the single holding head and in which this single holding head is turned upward on a pin disposed on its one end side. In this chip reversing action, the holding head turns while protruding upward of the chip transferring level. Depending upon the settings of the action timings of the individual units of the apparatus, therefore, an action interference may occur among the holding head being turned, a chip extract/transfer head for picking up the chip from the chip feed unit and placing it on the turning mechanism, and a chip mount unit for mounting the reversed chip transferred, on the substrate. In order to prevent that interference, moreover, the timing, at which the chip extract/transfer head or the chip mounting head can make access to the reversing mechanism, is restricted to obstruct an efficient chip mounting action.

SUMMARY OF THE INVENTION

The present invention is to provide a chip reversing device and a chip reversing method, and a chip mounting apparatus and a chip mounting method, which can make chip mounting actions efficient.

According to the invention, there is provided a chip reversing device for reversing a chip vertically by holding the chip placed in a horizontal position from a lower side thereof, comprising:

a reversing member on which a chip holding unit is arranged for holding the chip, and reversible vertically around a horizontal reversal shaft disposed in an end portion of the reversing member;

a reversal driving unit for turning the reversing member downward on the reversal shaft to change an orientation of the chip holding unit vertically;

a chip receiving unit for receiving a chip from the chip holding unit, the chip being held on the chip holding unit in a downward position after vertically reversed from an upward position on the chip holding unit by changing the orientation of the chip holding unit; and a moving unit for moving the chip receiving unit to a receiving position, at which the chip receiving unit receives a chip from the chip holding unit in the downward position, and to a retracted position, at which the chip receiving unit does not interfere with the reversing member.

According to the invention, there is provided a chip mounting apparatus for mounting a chip fed by a chip feed unit on a substrate held on a substrate holding unit after reversing the chip vertically, comprising:

a chip reversing device for receiving and vertically reversing the chip picked up from the chip feed unit by a chip pick-up/transfer device; and a chip mount unit for receiving and mounting the chip, as vertically reversed by the chip reversing device, on the substrate; and wherein the chip reversing device includes:

a reversing member on which a chip holding unit is arranged for holding the chip, and reversible vertically around a horizontal reversal shaft disposed in an end portion of the reversing member;

a reversal driving unit for turning the reversing member downward on the reversal shaft to change an orientation of the chip holding unit vertically;

a chip receiving unit for receiving a chip from the chip holding unit, the chip being held on the chip holding unit in a downward position after vertically reversed from an upward position on the chip holding unit by changing the orientation of the chip holding unit; and a moving unit for moving the chip receiving unit to a receiving position, at which the chip receiving unit receives a chip from the chip holding unit in the downward position, and to a retracted position, at which the chip receiving unit does not interfere with the reversing member.

According to the invention, there is a chip reversing method for reversing a chip vertically by a chip reversing device including a reversing member on which a chip holding unit is arranged for holding the chip, and reversible vertically around a horizontal reversal shaft disposed in an end portion of the reversing member, and a chip receiving unit for receiving a chip in a downward position from the chip holding unit, comprising:

a chip holding step of placing and holding a chip on the chip holding unit in an upward position;

a reversing step of vertically reversing the chip held on the chip holding unit by turning the reversing member downward on the reversal shaft to change an orientation of the chip holding unit vertically;

a chip receiving step of receiving the vertically reversed chip from the chip holding unit in a downward position by the chip receiving unit; and a chip receiving unit moving step of moving the chip receiving unit to a receiving position to receive the chip from the chip holding unit in the downward position, and to a retracted position to cause no interference with the reversing member.

According to the invention, there is provided a chip mounting method for mounting a chip fed by a chip feed unit on a substrate held on a substrate holding unit after reversing the chip vertically, comprising:

a chip holding step of placing and holding the chip on a chip holding unit of a chip reversing device after picking up the chip from the chip feed unit by a chip pick-up/transfer device;

a reversing step of reversing the held chip vertically by the chip reversing device;

a chip transferring step of transferring the vertically reversed chip to a chip mount unit; and a mounting step of mounting the transferred chip on the substrate by the chip mount unit, wherein chip mounting actions are repeatedly executed for mounting a plurality of chips, each chip mounting action including the chip holding step, the reversing step, the chip transferring step and the mounting step, before the chip mounting action for one chip is completed, the chip mounting action for a next chip is not started.

According to the invention, moreover, there is provided a chip mounting method for mounting a chip fed by a chip feed unit on a substrate held on a substrate holding unit after reversing the chip vertically, comprising:

a chip holding step of picking up the chip from the chip feed unit by a chip pick-up/transfer device and for placing and holding the chip on a chip holding unit of a chip reversing device; a reversing step of reversing the held chip vertically by the chip reversing device; a chip transferring step of transferring the vertically reversed chip to a chip mount unit; and a mounting step of mounting the transferred chip on the substrate by the chip mount unit, wherein chip mounting actions are repeatedly executed for mounting a plurality of chips, each chip mounting action including the chip holding step, the reversing step, the chip transferring step and the mounting step, an overlap is allowed between an execution timing from the chip transferring step to the mounting step for one chip and an execution timing from the chip holding step to the reversing step for a next chip.

According to the invention, there is adopted the constitution, in which the chip is placed and held on the chip holding unit in the upward position, and in which the reversing member is turned downward on the reversal shaft to reverse the chip held on the chip holding unit, vertically. Therefore, the reversing member is prevented from protruding upward of the height level for the chip transfer so that the interference with the chip pick-up head or the chip mounting head can be eliminated to make the chip mounting action efficient.

BRIEF DESCRIPTION OF THE DRAWINGS

FIGS. 4A through 4C present action explaining diagrams of the parts inversion stage in the chip mounting apparatus of Embodiment 1 of the invention.

DETAILED DESCRIPTION OF THE PREFERRED EMBODIMENTS

Embodiment 1

Figure 1:
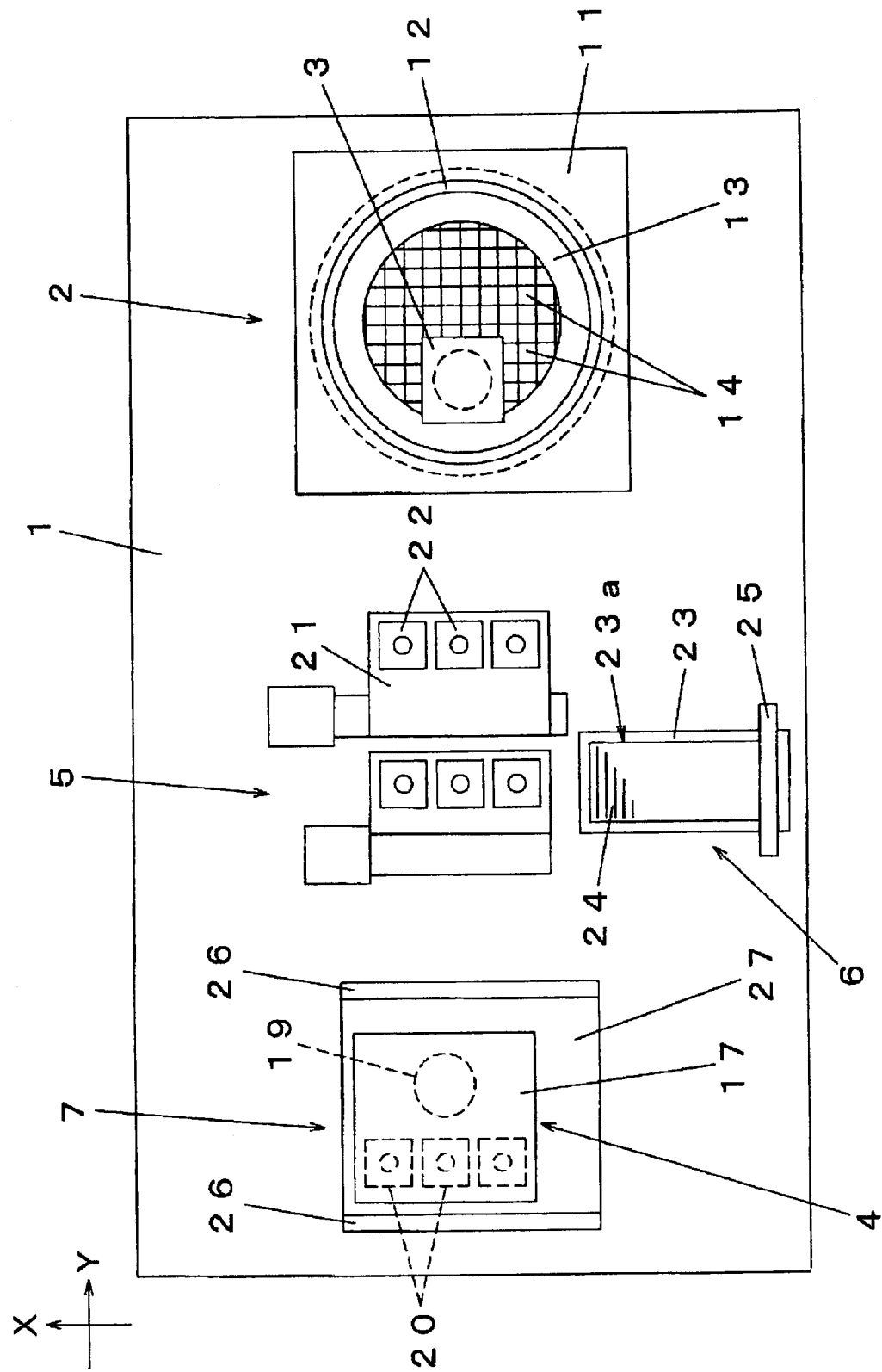
FIG. 1 is a top plan view of a chip mounting apparatus of Embodiment 1 of the invention.
Figure 2:
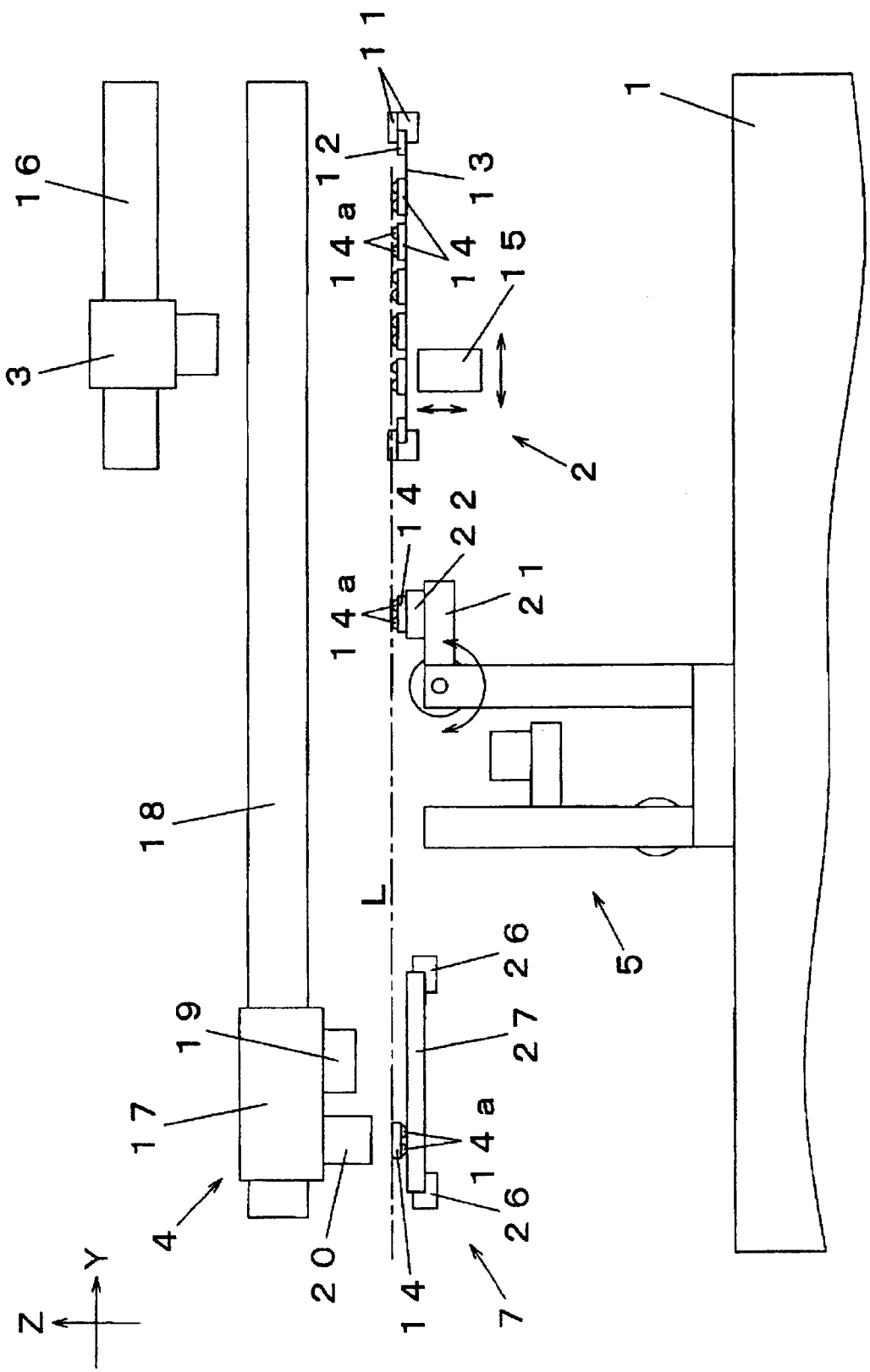
FIG. 2 is a side elevation of the chip mounting apparatus of Embodiment 1 of the invention.
Figure 3A:
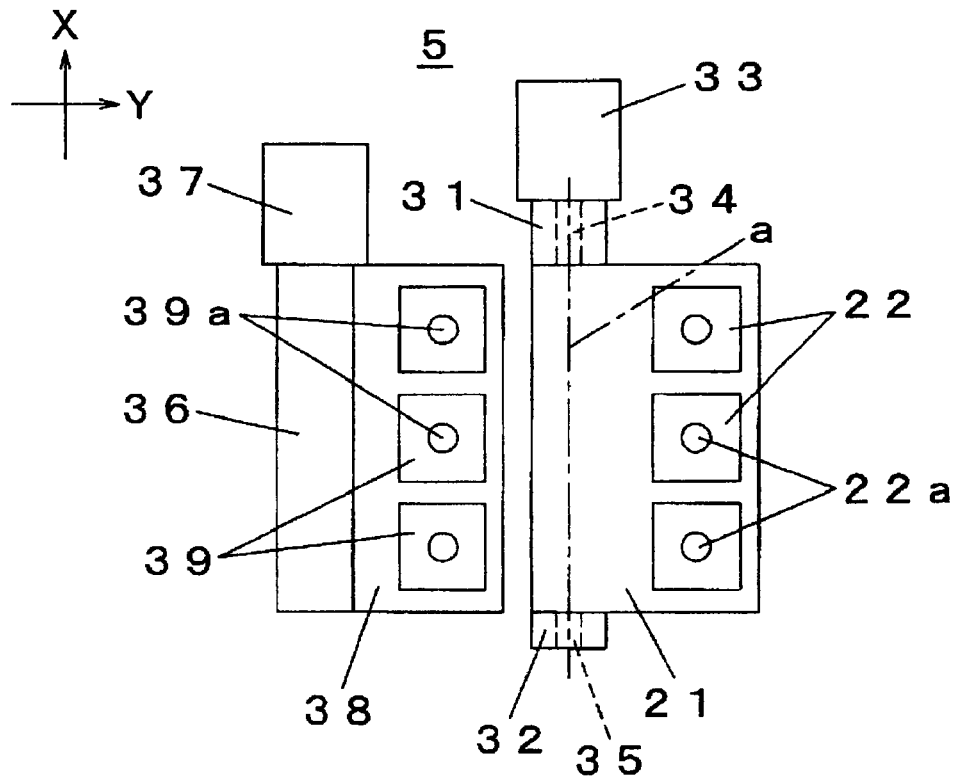
FIGS. 3A and 3B present structure explaining diagrams of a parts inversion stage in the chip mounting apparatus of Embodiment 1 of the invention.
Figure 3B:
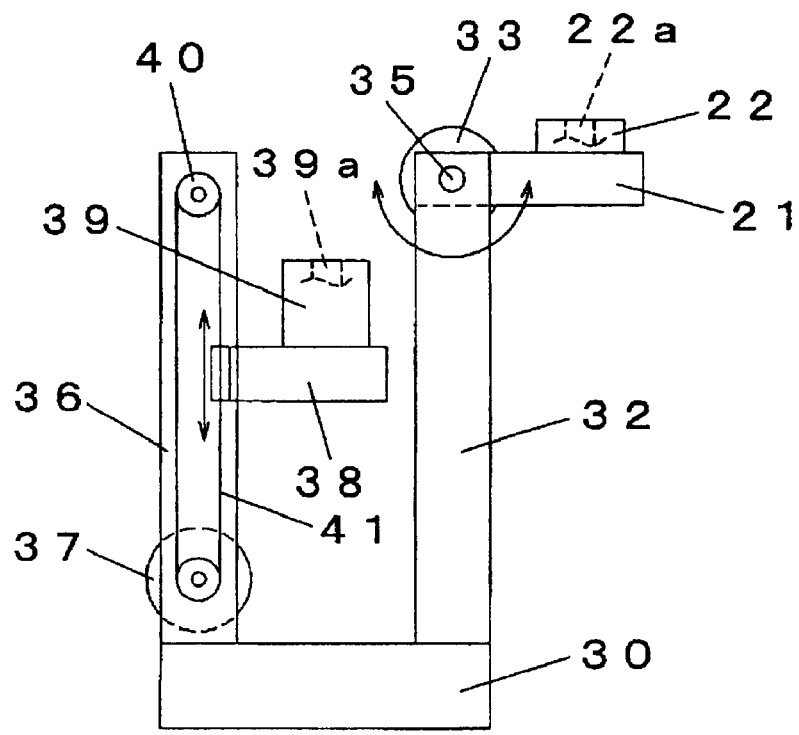

FIG. 1 is a top plan view of a chip mounting apparatus of Embodiment 1 of the invention; FIG. 2 is a side elevation of the chip mounting apparatus of Embodiment 1 of the invention; FIGS. 3A and 3B present structure explaining diagrams of a parts inversion stage in the chip mounting apparatus of Embodiment 1 of the invention; FIGS. 4A through 4C present action explaining diagrams of the parts inversion stage in the chip mounting apparatus of Embodiment 1 of the invention; and FIGS. 5A through 10B are action explaining diagrams of chip mounting actions in Embodiment 1 of the invention.

At first, the entire structure of the chip mounting apparatus is described with reference to FIG. 1 and FIG. 2. This chip mounting apparatus has functions to reverse chip parts having connecting electrodes or bumps formed on one side face, up-side-down, and to mount the reversed chip parts on a substrate by a mounting head 17. On a base 1, as shown in FIG. 1 and FIG. 2, there are arranged in a Y-direction: a chip feed unit 2 for feeding the chips; a chip reversing device 5; and a substrate holding unit 7 for positioning and holding the substrate. The chip reversing device 5 has functions to receive the chip, as picked up by a chip pick-up/transfer device, from the chip feed unit 2, and to reverse the chip up-side-down.

A chip recognize camera 3 is so arranged over the chip feed unit 2 as can be freely moved in the horizontal direction by a camera moving mechanism 16, and a flux transfer unit 6 is arranged sideway of the chip reversing device 5 in an X-direction. A chip mounting mechanism 4 is arranged over the base 1. The chip reversing device 5 is constituted such that a mounting head 17 is moved by a head moving mechanism 18 within a moving range of the chip feed unit 2, the chip reversing device 5, the flux transfer unit 6 and the substrate holding unit 7. This constitution performs the chip bonding action, in which the chip fed by the chip feed unit 2 is vertically reversed by the chip reversing device 5 and mounted on the substrate held by the substrate holding unit 7.

Here are explained the structures of the individual units. The chip feed unit 2 is equipped with a jig holder 11, which removably holds a ring-shaped jig 12 having a sheet 13 mounted thereon. Semiconductor chips 14 (as will be simply abbreviated into the "chips") are so adhered to the sheet 13 as are individually separated from each other. A plurality of bumps 14a or protruding electrodes are formed on the upper face of the chip 14. With the jig 12 being held on the jig holder 11, the chip feed unit 2 feeds the plural chips 14 in a face-up position with the bump forming face being directed upward.

When the chip recognize camera 3 is moved by the camera moving mechanism, it is horizontally moved above the chip feed unit 2 so that it can photograph downward any of the chips 14 adhered to the sheet 13. When the photograph result of the chip recognize camera 3 is recognized, the position of the chip 14 in the chip feed unit 2 can be recognized. When the chip is picked up from the chip feed unit 2 by the mounting head 17, as will be described hereinbefore, the mounting head 17 is positioned to the chip 14 to be picked up.

Below the sheet 13 held by the jig holder 11, as shown in FIG. 2, an ejector mechanism 15 is so arranged by the (not-shown) ejector moving mechanism as can freely move vertically and horizontally. The ejector mechanism 15 is equipped with a pin lifting mechanism for moving up and down the (not-shown) chip picking ejector pin. When the chip 14 is picked up from the sheet 13 by the mounting head 17, the ejector pin picks up the chip 14 from below the sheet 13 so that the chip 14 is peeled from the sheet 13. The ejector mechanism 15 acts as sheet peeling means for peeling the chip 14 from the sheet 13. This sheet peeling means should not be limited to the pick-up method using the ejector pin but can be exemplified by various methods such as the method, in which the sheet 13 is peeled from the chip 14 by sucking it in vacuum from the lower side thereof, or the method, in which the adhesion of the chip is reduced by irradiating the sheet 13 from the lower side with an ultraviolet ray.

The chip mounting mechanism 4 is constituted by mounting a substrate recognize camera 19 and one or more (e.g., three) bonding nozzles 20 on the mounting head 17 which is horizontally moved by the head moving mechanism 18. As shown in FIG. 1, the bonding nozzles 20 are provided with suction holes 20a for sucking and holding the chips 14 so that they can suck, hold and transfer the three chips 14 simultaneously. In the chip pick-up action, the mounting head 17 is moved to above the chip feed unit 2 by the head moving mechanism 18. Then, the bonding nozzles 20 are positioned to the chips 14 to be picked up, and are caused to perform the chip sucking actions thereby to suck and hold the chips 14 with their suction holes 20a. At this time, reference is made to the position recognition result, which has been obtained by photographing the chips 14 with the chip recognize camera 3. The chips 14, as retracted in the face-up positions from the chip feed unit 2 by the mounting head 17, are transferred to the chip reversing device 5.

The chip reversing device 5 is arranged on the upper face of the base 1 at a position spaced in the Y-direction from the chip feed unit 2. The chip reversing device 5 is equipped, on its one side face, with a reversing member 21 having chip holding units 22 arranged thereon. The chips 14, as picked up in the face-up positions from the chip feed unit 2 by the mounting head 17 and placed on the chip holding units 22, are reversed vertically by reversing the reversing member 21. The chips 14, as reversed to face-down positions, are transferred again to the mounting head 17 by the later-described chip receiving units 39, so that they are transferred to the flux transfer unit 6 (FIG. 1) by the mounting head 17.

The flux transfer unit 6 is equipped with a box-shaped flux container 23, which is provided with a recess 23a having a smooth bottom face. A flux 24 is extended in a film shape in the recess 23a by a squeegee 25. The mounting head 17 holding the chips 14 with the bonding nozzles 20 is moved to over the flux container 23. Then, the bonding nozzles 20 are moved up and down to push the chips 14 onto the bottom face of the recess 23a thereby to cause a flattening for pushing the bumps 14a on the lower face of the chips 14 slightly to homogenous heights and to transfer the flux 24 to the bumps 14a.

The mounting head 17 holding the flux-transferred chips 14 is moved to the substrate holding unit 7. As a result, the substrate recognize camera 19 is positioned above a substrate 27 held on a substrate transfer conveyor 26, so that it can photograph the chip mounting position of the substrate 27 downward. By recognizing this photograph result, moreover, the chip mounting positions on the substrate 27 are recognized. When the chips 14 held on the bonding nozzles 20 are mounted on the substrate 27, the chips 14 are positioned with respect to the chip mounting positions of the substrate 27 on the basis of that position recognition result. As a result, the chip mounting mechanism 4 acts as a chip mount unit for receiving a chips vertically reversed by the chip reversing device 5 and for mounting the chips on the substrate. In this embodiment, the chip mount unit also acts as a chip pick-up/transfer device for picking up the chips 14 from the chip feed unit 2 and transferring the chips 14 to the chip reversing device.

In the constitution thus far described, the chip extraction height in the chip feed unit 2 for the bonding nozzles 20 to extract the chips 14, the chip placing height in the chip reversing device 5 for the chips 14 held by the bonding nozzles 20 to be placed on the reversing member 21, the chip transfer height for the chips 14 reversed by the chip reversing device 5 to be transferred to the mounting head 17, and the chip mounting height in the substrate holding unit 7 for the chips 14 to be mounted on the substrate 27 are all set at the identical height level L, as shown in FIG. 2. As a result, the individual actions to extract, place, transfer and mount the chips 14 can be done by the common mounting head 17 having the fixed transfer height level. Here, the height level need not be set to the common level L but may be made more or less different.

Next, the structure and function of the chip reversing device 5 are explained with reference to FIG. 3A through FIG. 4C. In FIGS. 3A and 3B, a base member 30 is horizontally fixed on the upper face of the base 1, and bearing brackets 31 and 32 are erected to confront in the X-direction at the end portions, as taken in the Y-direction, of the upper face of the base member 30. In the pin holes formed in the X-direction in the upper end portions of the bearing brackets 31 and 32, there are horizontally borne such reversal shafts 34 and 35 as are extended coaxially (on an axis a) from the two end faces of the reversing member 21. The reversal shaft 34, as borne on the bearing bracket 31, is rotationally driven by a reversal driving unit 33. This reversal driving unit 33 can be exemplified by a motor with a reduction gear or an air-driven rotation actuator.

When the reversal driving unit 33 is activated, the reversing member 21 rotates on the horizontal reversal shafts 34 and 35 having the axis a. Here, the reversal shafts 34 and 35 are positioned offset to the one (located on the left side of the Y-direction in FIGS. 3A and 3B) end portion in the reversing member 21. In the rotations around the reversal shafts 34 and 35, the reversing member 21 can take such an action mode that it does not protrude the space above the reversal shafts 34 and 35. Here, the constitution for holding the reversing member 21 in a vertically invertible state should not be limited to that, in which the reversing member 21 is borne at its two ends by the two bearing brackets 31 and 32, but may be changed to another constitution, in which the reversing member 21 is borne in a cantilever manner on the drive side, i.e., exclusively by the bearing bracket 31.

On one side face (i.e., the upper face in FIG. 3B) of the reversing member 21, there are disposed one or more (e.g., three) chip holding units 22 which are located at the positions corresponding to the array of the bonding nozzles 20 in the mounting head 17. Suction holes 22a, as disposed in the chip holding units 22, are connected to the (not-shown) vacuum suction means disposed in the chip holding units 22. By the vacuum suctions from the suction holes 22a, the chip holding units 22 can suck and hold the chips 14 which have been placed by the bonding nozzles 20. The chip holding units 22 are made removable with respect to the reversing member 21 so that chips 14 of different kinds can be sucked and held by replacing the chip holding units 22. In other words, the chip holding units 22 for holding the chips 14 are arranged on the reversing member 21 so that they can be reversed up-side-down on the horizontal reversal shafts 34 and 35 disposed at one end portion.

When the reversal driving unit 33 is activated to reverse the reversing member 21, the chip holding units 22 can be vertically reversed. As shown in FIGS. 3A and 3B, more specifically, the chip holding units 22 are turned from the upward states to the downward states by turning the reversing member 21 downward on the reversal shafts 34 and 35. As a result, the chips 14, as held by the chip holding units 22, are vertically reversed from the face-up positions to the face-down positions. In short, the reversal driving unit 33 acts as reversal driving means for turning the reversing member 21 on the reversal shafts 34 and 35 (or on the axis a) thereby to change the vertical directions of the chip holding units 22.

In the turning range of the reversing member 21 at this time, the turning drive angle of the reversal shaft 34 by the reversal driving unit 33 is controlled to such a drive mode, in which the reversing member 21 turns only in the space on the lower sides of the reversal shafts 34 and 35. As a result, the reversing member 21 and the chip holding units 22 do not act to extrude largely over the height level L, as shown in FIG. 2, so that no interference occurs between the horizontal moving action of the mounting head 17 and the inversion action of the reversing member 21 in the chip reversing device 5.

As a result, the chip reversing action in the chip reversing device 5 and the chip transfer action by the mounting head 17 can be performed at free timings without any correlation, so that no mutual timing restriction need be considered on the apparatus action sequence. In the device of the prior art constituted to perform the chip reversing action by turning the reversing member upward, therefore, it is possible to eliminate the spare standby time period which has been needed to avoid the interference between the mounting head and the reversing member. This results in an advantage that the working action efficiency can be improved.

On the left end portion of the base member 30, there is erected a lifting mechanism 36, which is equipped with a motor 37. A lifting member 38 is vertically movably mounted on the side face of the lifting mechanism 36. In this lifting mechanism 36, there are mounted a guide mechanism for guiding the vertical movement of the lifting member 38, and a lifting drive mechanism (e.g., a belt-drive direct action mechanism or a ball-and-screw direct action mechanism) for converting the rotations of the motor 37 into the vertical movements, so that the lifting mechanism 38 can be moved up and down by activating the motor 37. Here, a pulley 40 or a transmission belt 41 is used as the lifting drive mechanism.

On the upper face of the lifting member 38, there are disposed one or more (e.g., three) chip receiving units 39 in a manner to correspond to the array positions of the chip holding units 22 in the reversing member 21, namely, so that the chip receiving units 38 are positioned to face each other just below the chip holding units 22 which are given the downward positions by the inversion of the reversing member 21. The chip receiving units 39 are provided with suction holes 39a so that the chips 14 can be held on the chip receiving units 39 by sucking them in vacuum from the suction holes 39a.

The chip receiving units 39 are also made removable like the chip holding units 22, and can be replaced by others for the target chips 14.

Next, the functions of the chip reversing device 5 are explained with reference to FIGS. 4A through 4C. FIG. 4A shows the state, in which the chips 14 picked up in the face-up positions having the upward bumps 14a from the chip feed unit 2 by the bonding nozzles 20 are held on the chip holding units 22 in the upward positions. After the chips 14 were placed and held on the chip holding units 22 by moving the bonding nozzles 20 vertically, the reversing member 21 is turned by 180 degrees downward (or clockwise) on the reversal shaft 35, and the chip holding units 22 holding the chips 14 is turned downward. As a result, the chips 14 are held in such face-down positions on the chip holding units 22 that the bumps 14a are directed downward.

In the downward turn of the reversing member 21, the chip receiving units 39 and the lifting member 38 are once moved in advance to retracted positions (i.e., the chip receiving units 39 and the lifting member 38, as indicated by chained lines), in which no positional interference with the reversing member 21 occurs. When the turn of the reversing member 21 is completed to reverse the chips 14 vertically, the chip receiving units 39 are lifted to receiving positions (i.e., the chip receiving units 39, as indicated by solid lines), and the chips 14 are held and received from the side of the bumps 14a by the chip receiving units 39.

Specifically, the chip receiving units 39 receive the chips 14, which are held by the chip holding units 22 in the upward positions and vertically reversed by changing the vertical direction of the chip holding units 22, from the chip holding units 22 in the downward positions. Moreover, the lifting mechanism 36 and the motor 37 constitute chip acceptance moving means for moving the chip receiving units 39 to the receiving positions, in which the chips 14 are received from the chip holding units 22 in the downward positions, and the retracted positions, in which no interference with the reversing member 21 occurs.

After this, as shown in FIG. 4C, the chip receiving units 39 rise to the positions, in which the upper faces of the held chips 14 reach the height level L (as termed as the chip transfer height) shown in FIG. 2, and stand by at those positions. After the chips 14 in this state were held by the bonding nozzles 20 of the mounting head 17, the operation advances to the flux transfer by the flux transfer unit 6, as has been described hereinbefore. In case the bonding nozzles 20 have sufficient vertical strokes, the chip transfer height may be that of the receiving positions, as indicated by solid lines in FIG. 4B, which are lower than the height level L.

Specifically, the chip reversing method shown in FIGS. 4A through 4C is one for reversing the chips 14 vertically by the chip reversing device 5 which is equipped with the reversing member 21 and the chip receiving units 39. The chip reversing method has a mode including: the chip holding step of placing and holding the chips 14 on the chip holding units 22 in the upward positions; the reversing step of reversing said chips held on the chip holding units 22, vertically by turning the reversing member 21 downward on the reversal shafts 34 and 35 thereby to change the vertical direction of the chip holding units 22; the chip receiving step of receiving the vertically reversed chips 14 from the chip holding units 22 in the downward positions by the chip receiving units 39; and the chip receiving units moving step of moving the chip receiving units 39 to the receiving positions, in which the chips 14 are received from the chip holding units 22 in the downward positions, and the retracted positions, in which no interference with the reversing member 21 occurs. Here, in case the plural chips 14 are held at the aforementioned chip holding step, the plural chips 14 are simultaneously turned up-side-down at the reversing step.

With the chip mounting apparatus thus constituted, the chip mounting method for mounting the chips fed by the chip feed unit 2 on the substrate 27 held on the substrate holding unit 7, by reversing the chips 14 up-side-down is described in the following with reference to FIG. 5A to FIG. 10B. In the following individual drawings, the components, as thought to need no explanation, of the apparatus are suitably omitted from the drawings, and the illustration of the bumps 14a is omitted from the chips 14.

Figure 5A:
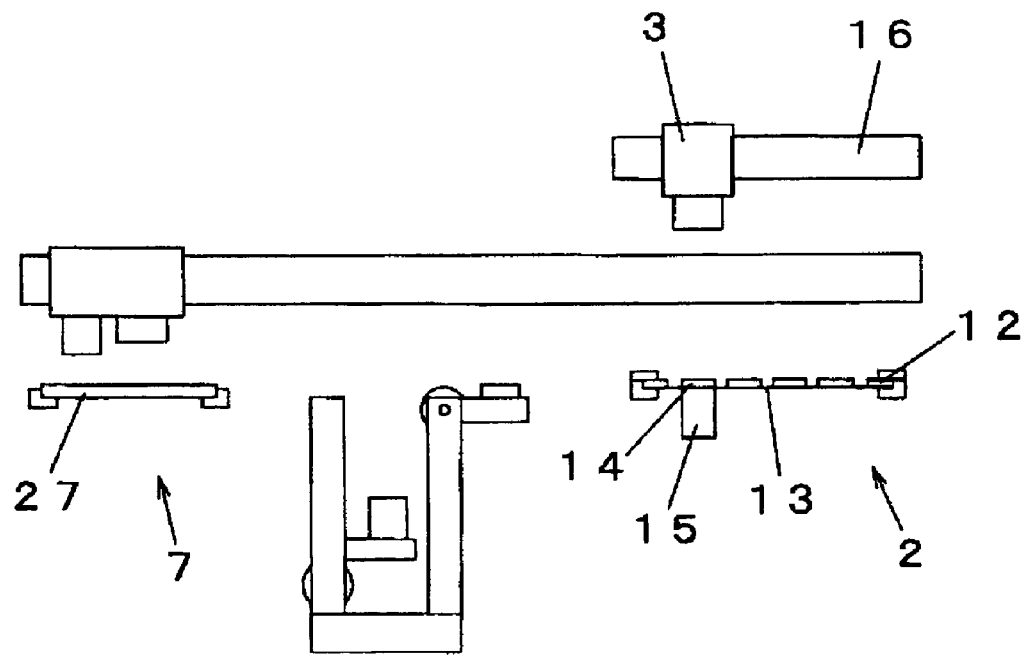
FIGS. 5A and 5B present action explaining diagrams of chip mounting actions in Embodiment 1 of the invention.

At first, FIG. 5A shows the state, in which the chip mounting action is to be started. The jig 12 having the plural chips 14 adhered to the sheet 13 is mounted on the chip feed unit 2, and the ejector mechanism 15 abuts against the lower face of the chip 14 to be picked up first of all. Above this chip 14 to be picked up, there is positioned the chip recognize camera 3 which has been moved by the camera moving mechanism 16. The chip recognize camera 3 takes the image of the chip 14 so as to recognize the position of the chip 14.

Figure 5B:
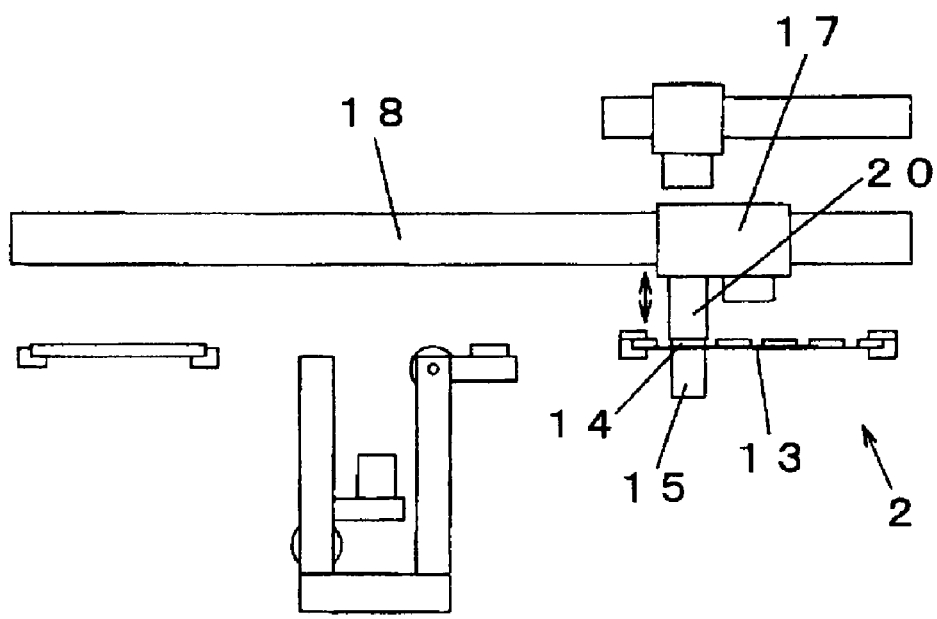

After this, the chip 14 is picked up. Specifically, the mounting head 17 is moved at first to above the chip feed unit 2 by the head moving mechanism 18, as shown in FIG. 5B. On the basis of the positional information of the chip 14, as obtained by recognizing the photograph result by the chip recognize camera, the bonding nozzle 20 is positioned to the chip 14 to be picked up. Then, the bonding nozzle 20 is lowered to suck and hold the chip 14, and is then lifted to peel and extract the chip 14 from the sheet 13. At this time, the peel of the chip 14 from the sheet 13 is promoted such that the lower side of the sheet 13 is picked up with the ejector pin by the ejector mechanism 15.

Figure 6A:
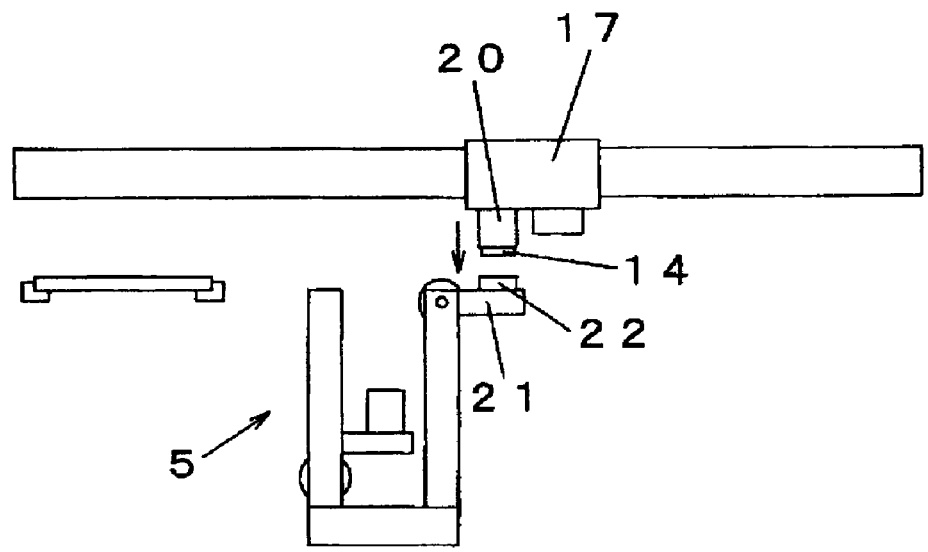
FIGS. 6A and 6B present action explaining diagrams of the chip mounting actions in Embodiment 1 of the invention.
Figure 6B:
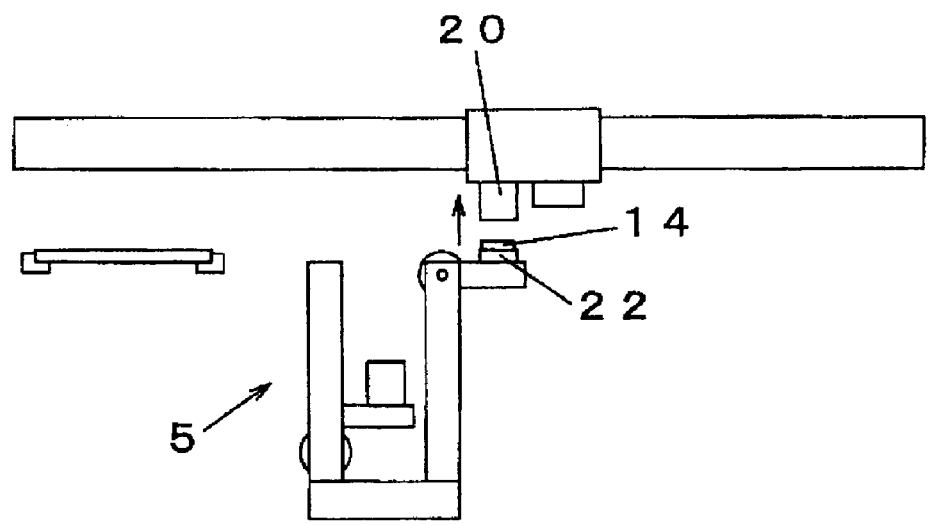
Figure 7A:
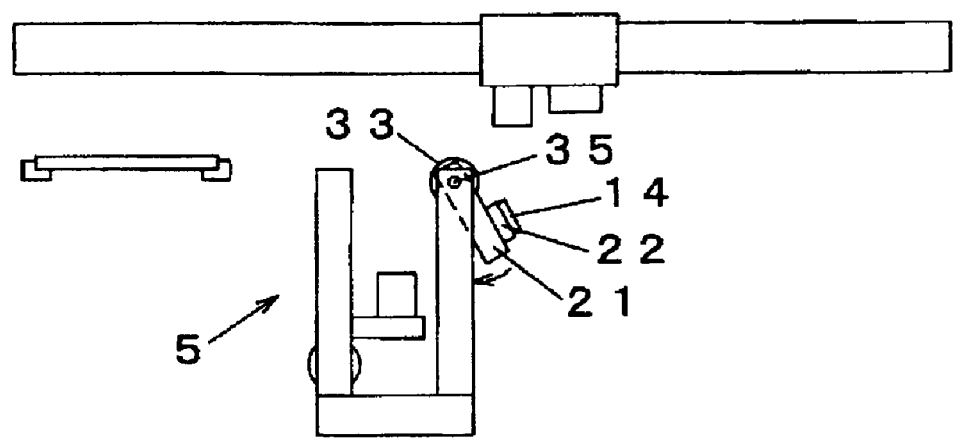
FIGS. 7A and 7B present action explaining diagrams of the chip mounting actions in Embodiment 1 of the invention.
Figure 7B:
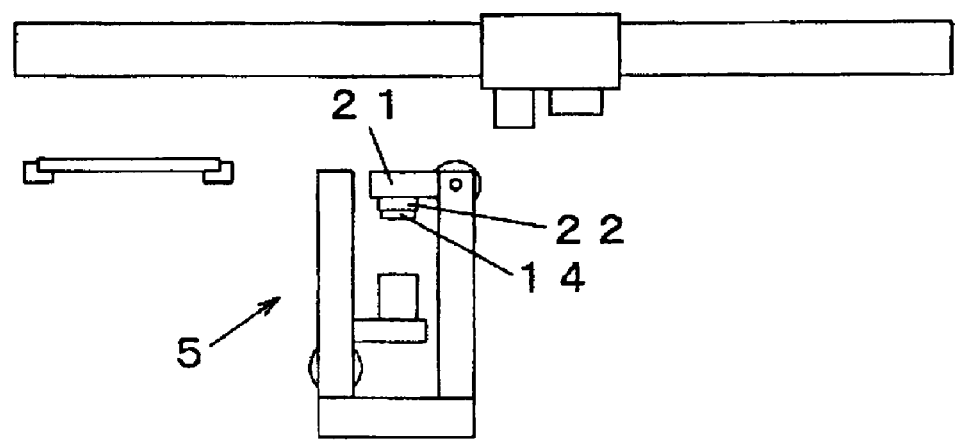

After this, the mounting head 17 holding the chip 14 at the bonding nozzle 20 moves to the chip reversing device 5, as shown in FIG. 6A. At this time, the reversing member 21 is in the state having the chip holding unit 22 directed upward. The bonding nozzle 20 is positioned to the chip holding unit 22 in this state, and is lowered toward the chip holding unit 22. When the chip 14 is placed and held on the chip holding unit 22, the bonding nozzle 20 moves up, as shown in FIG. 6B. In short, FIG. 5A through FIG. 6B show the chip holding step, at which the chip 14 is picked up from the chip feed unit 2 by the mounting head 17 acting as the chip pick-up/transfer device and is placed and held on the chip holding unit 22 of the chip reversing device 5.

Next, the reversing step of vertically reversing the chip 14 held on the chip holding unit 22 by the chip reversing device 5 is executed. Specifically, the reversing member 21 having the chip 14 held on the chip holding unit 22 is turned clockwise, i.e., downward of the reversal shaft 35. At this time, the reversing member 21 is turned by 180 degrees to bring the chip holding unit 22 into a downward position, so that the chip 14 held on the chip holding unit 22 is reversed up-side-down. In this reversing action, the chip receiving unit 39 is lowered to the retracted position, at which it has no interference with the reversing member 21 or the chip holding unit 22.

Figure 8A:
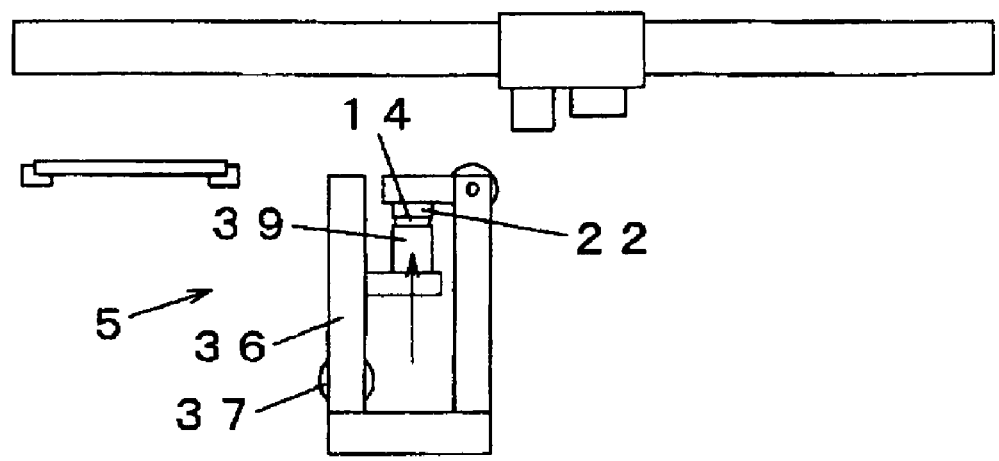
FIGS. 8A and 8B present action explaining diagrams of the chip mounting actions in Embodiment 1 of the invention.
Figure 8B:
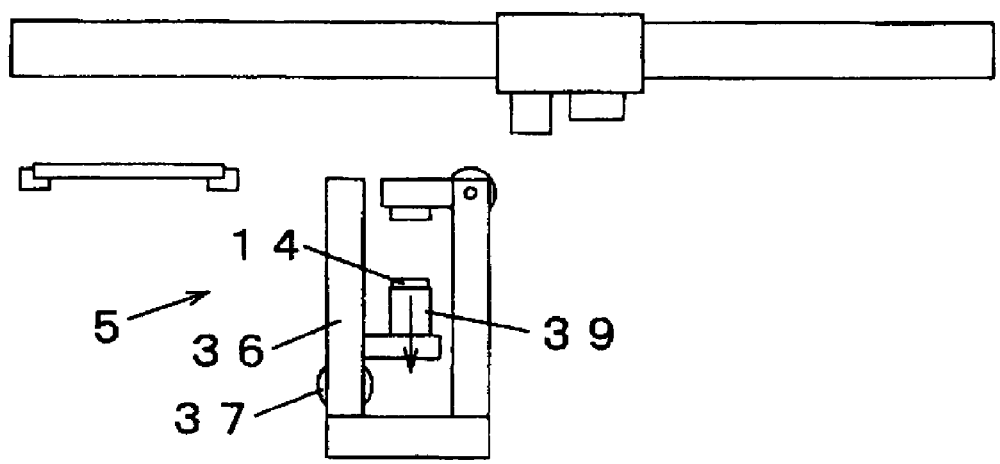
Figure 9A:
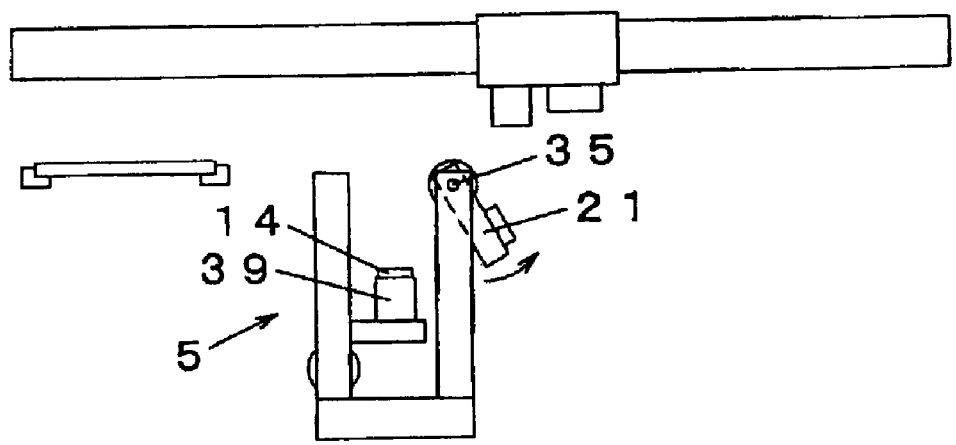
FIGS. 9A and 9B present action explaining diagrams of the chip mounting actions in Embodiment 1 of the invention.
Figure 9B:
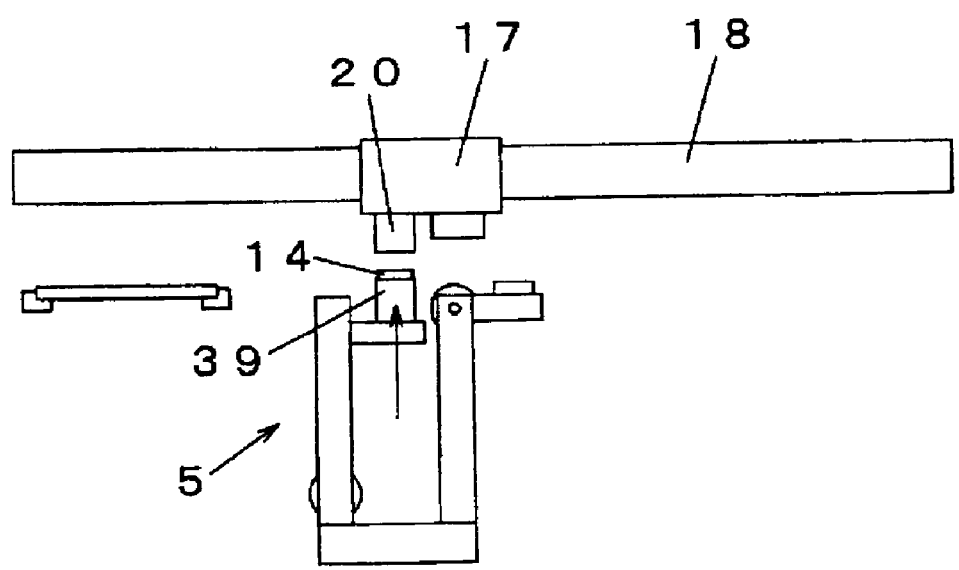

After this, the chip transferring step of transferring the vertically reversed chip 14 to the mounting head 17 of the chip mount unit is executed. Specifically, the chip receiving unit 39 is lifted by the lifting mechanism 36, as shown in FIG. 8A, to receive the chip 14 held on the chip holding unit 22. Then, the chip receiving unit 39 is lowered to the retracted position, as shown in FIG. 8B, and the reversing member 21 is then turned downward counter-clockwise, as shown in FIG. 9A. As a result, the reversing member 21 is returned to an original position, at which the chip holding unit 22 takes an upward position, and chip receiving unit 39 holding the chip 14 is lifted, as shown in FIG. 9B, to position the chip 14 at the height level L shown in FIG. 2. The bonding nozzle 20 is positioned and moved up and down with respect to the chip 14 in that state so that the chip 14 is held on and transferred to the bonding nozzle 20.

Figure 10A:
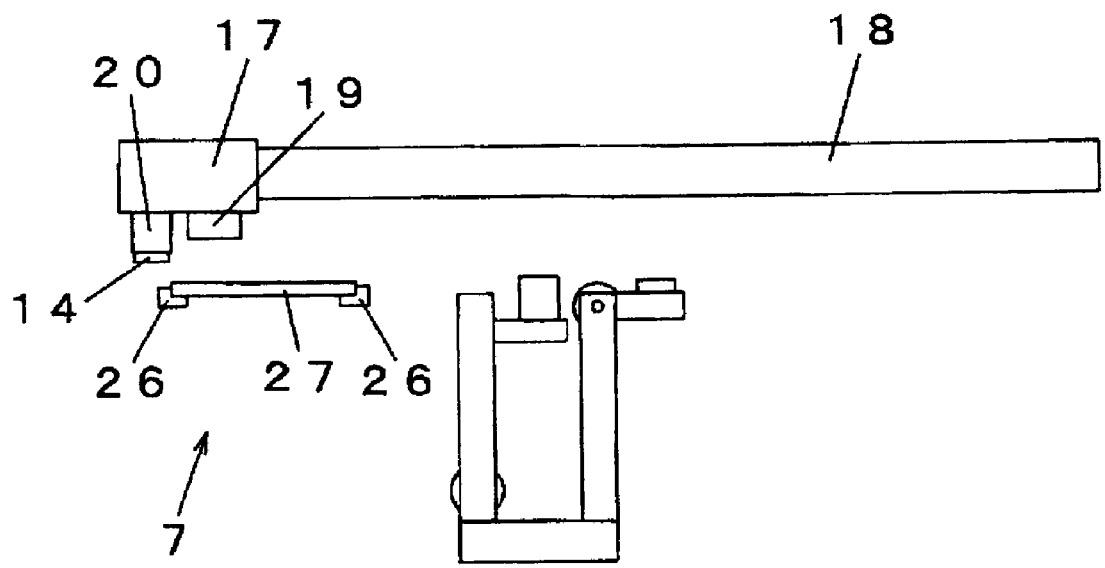
FIGS. 10A and 10B present action explaining diagrams of the chip mounting actions in Embodiment 1 of the invention.
Figure 10B:
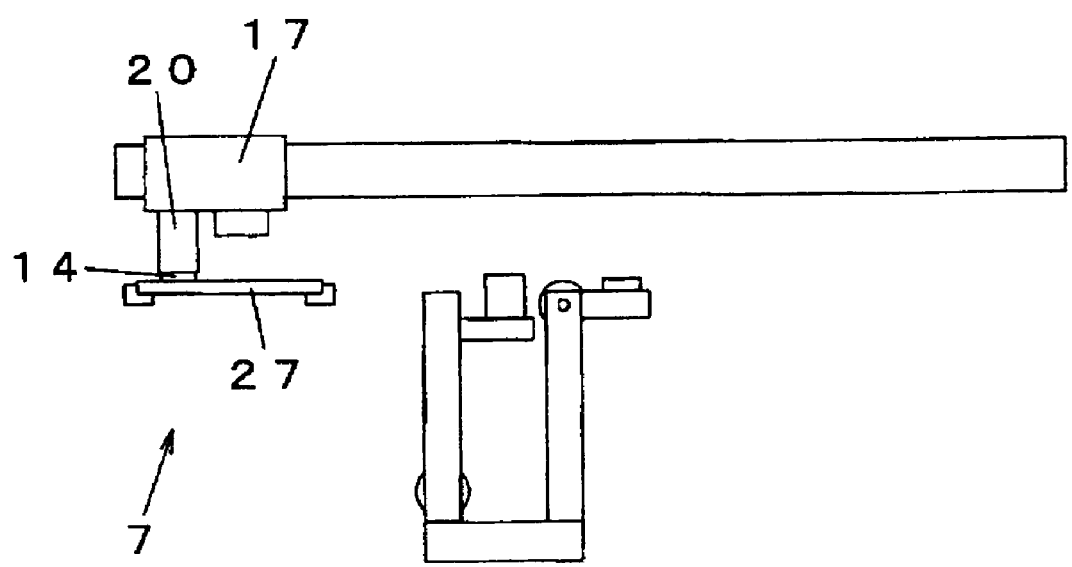
Figure 11A:
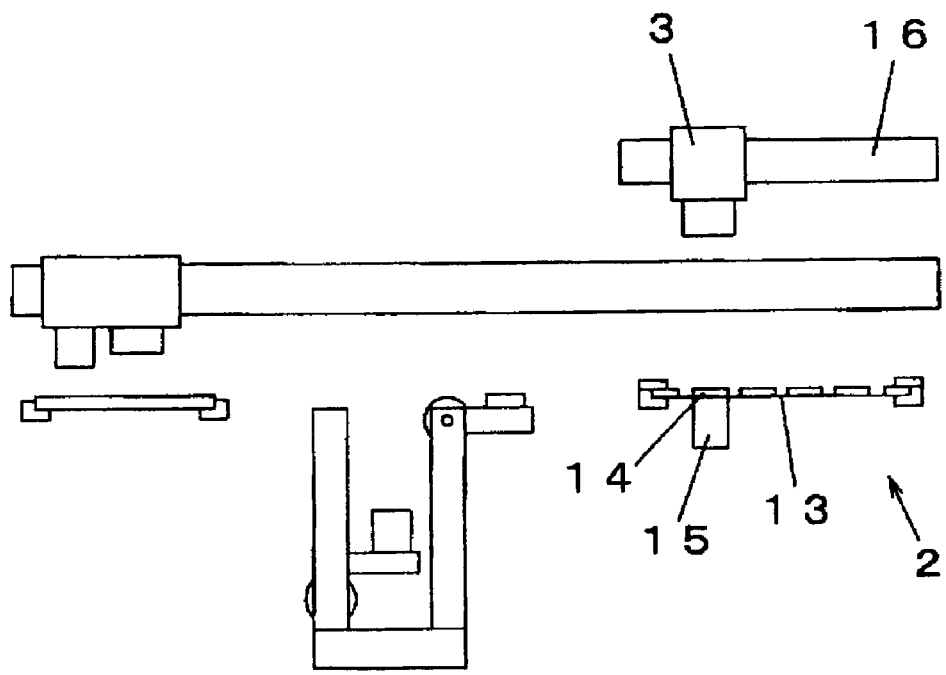
FIGS. 11A and 11B present action explaining diagrams of chip mounting actions in Embodiment 2 of the invention.
Figure 11B:
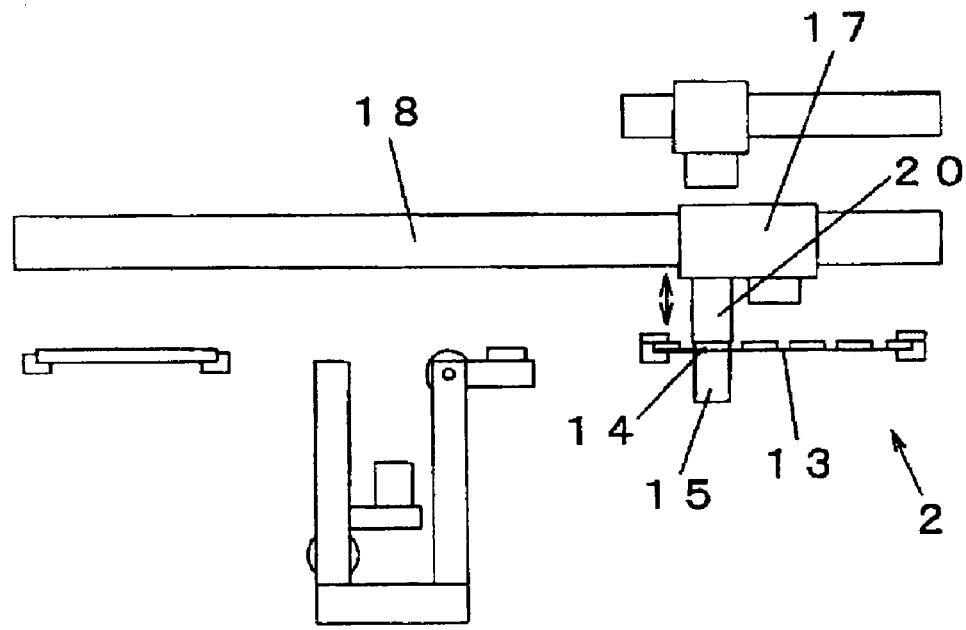
Figure 12A:
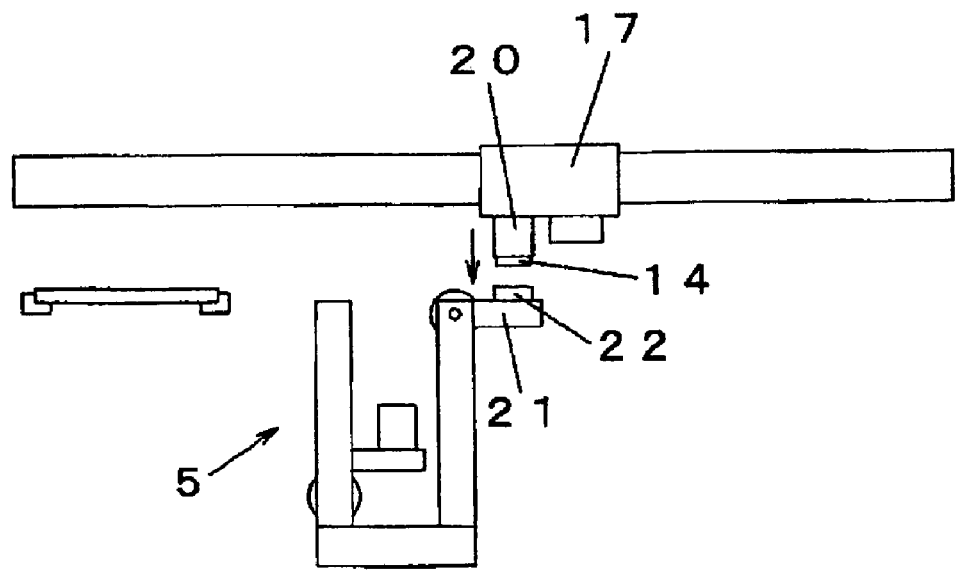
FIGS. 12A and 12B present action explaining diagrams of the chip mounting actions in Embodiment 2 of the invention.
Figure 12B:
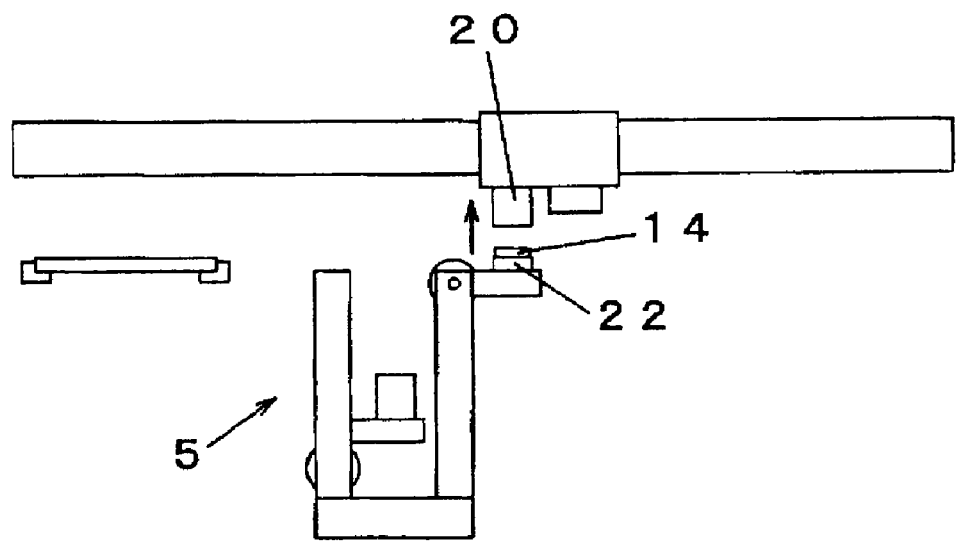

Next, the transferred chip 14 is conveyed to the flux transfer unit 6 by the chip mount unit, and the flux 24 is transferred to the chip 14. After this, the mounting step of mounting the chip 14 on the substrate 27. Specifically, the mounting head 17 having the flux-transferred chip 14 on the bonding nozzle 20 is moved to above the substrate holding unit 7, as shown in FIG. 1A. Then, the chip-mounted position of the substrate 27 is photographed for the position recognition by the substrate recognize camera 19. Next, the mounting head 17 is positioned with respect to the substrate 27 on the basis of the position recognition result, and the chip 14 is mounted on the substrate 27, as shown in FIG. 10B. The first chip 14 thus picked up from the chip feed unit 2 is mounted on the substrate 27, thus completing a series of chip mounting actions. After this, the chip mounting actions composed of the individual action steps, as shown in FIG. 6A to FIG. 10B, are executed from the first on the next chip to be successively mounted.

Specifically in the chip mounting method according to this embodiment, the chip mounting actions including the chip holding step, the repeating step, the chip transferring step and the mounting step thus far described are repeatedly executed on the plural chips. In this procedure, before the chip mounting actions on one chip are completed, the chip mounting actions on the next chip to be mounted subsequent to that one chip are not started. As a result, the chip mounting actions to extract and mount numerous chips of the same kind continuously are advantageous in that the history of the chips can be easily traced in case product failures are caused due to the defects of the chips.

At the aforementioned reversing step, moreover, the chip 14 held on the chip holding unit 22 is vertically reversed by turning the reversing member 21 downward on the reversal shafts thereby to change the vertical position of the chip holding unit 22. As a result, no interference occurs between the horizontal moving action of the mounting head 17 and the reversing action of the reversing member 21 so that the spare standby time period, as might otherwise be needed in the conventional apparatus for avoiding the interference between the mounting head and the reversing member, can be eliminated to improve the working action efficiency.

Embodiment 2

FIGS. 11A through 16 are action explaining diagrams of chip mounting actions in Embodiment 2 of the invention. In Embodiment 2, too, the chip, as fed by the chip feed unit 2, is vertically reversed and mounted on the substrate 14 held on the substrate holding unit 7 by using a chip mounting apparatus like that of Embodiment 1. In the following individual drawings, the components, as thought to need no explanation, of the apparatus are also suitably omitted from the drawings, and the illustration of the bumps 14a is omitted from the chips 14.

Figure 13A:
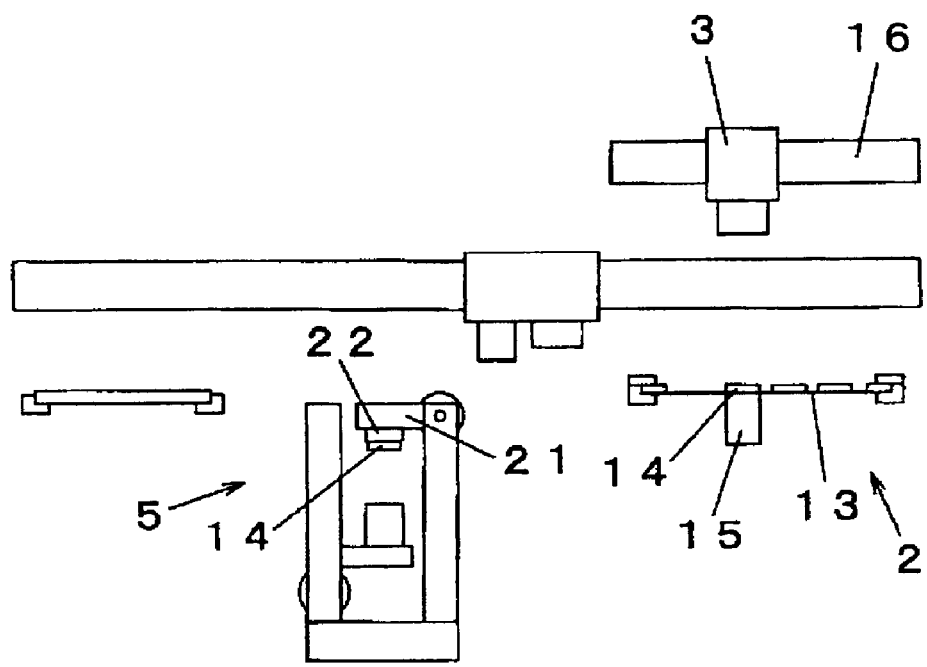
FIGS. 13A and 13B present action explaining diagrams of the chip mounting actions in Embodiment 2 of the invention.

At first, FIG. 11A through FIG. 12B show the chip holding step, as shown in FIGS. 5A through 6B in Embodiment 1, at which the chip 14 is picked up from the chip feed unit 2 by the chip pick-up/transfer device and is placed and held on the chip holding unit 22 of the chip reversing device 5. Next, the reversing step of reversing the chip 14 held on the chip holding unit 22, vertically by the chip reversing device 5, is executed. Specifically, the reversing member 21 having the chip 14 held on the chip holding unit 22 is turned downward clockwise on the reversal shafts 34 and 35. As shown in FIG. 13A, moreover, the reversing member 21 is turned by 180 degrees so far as the chip holding unit 22 takes the downward position, thereby to reverse the chip 14 held on the chip holding unit 22, vertically. At this time, the chip receiving unit 39 has moved down to the retracted position, at which it has no interference with the reversing member 21 or the chip holding unit 22.

Figure 13B:
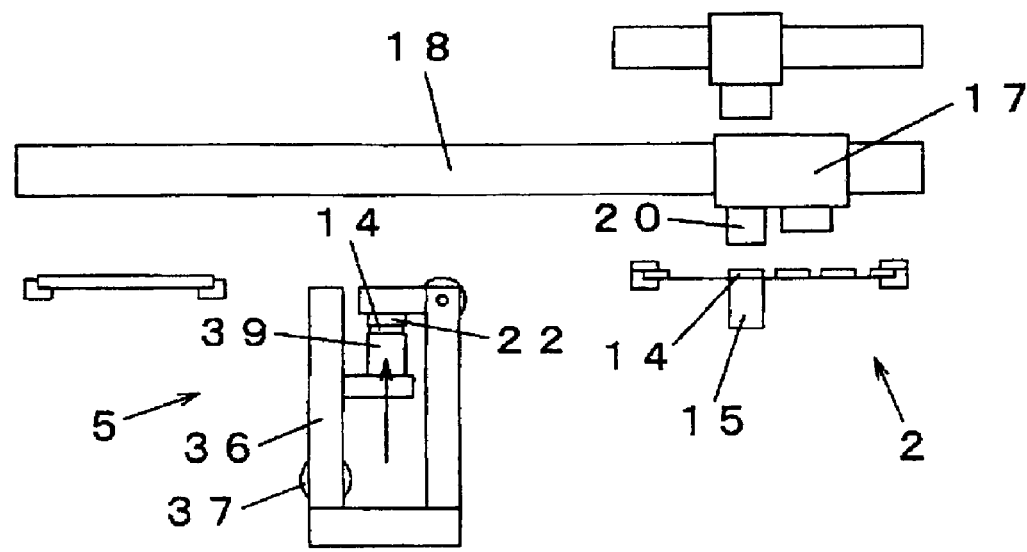

After this, the chip transferring step, at which the vertically reversed chip 14 is transferred to the chip mount unit. Specifically, as shown in FIG. 13B, the chip receiving unit 39 is lifted by the lifting mechanism 36 so that it receives the chip 14 held on the chip holding unit 22. In parallel with this chip receiving action, moreover, the chip feed unit 2 executes the chip pick-up action on the succeeding next chip 14.

Figure 14A:
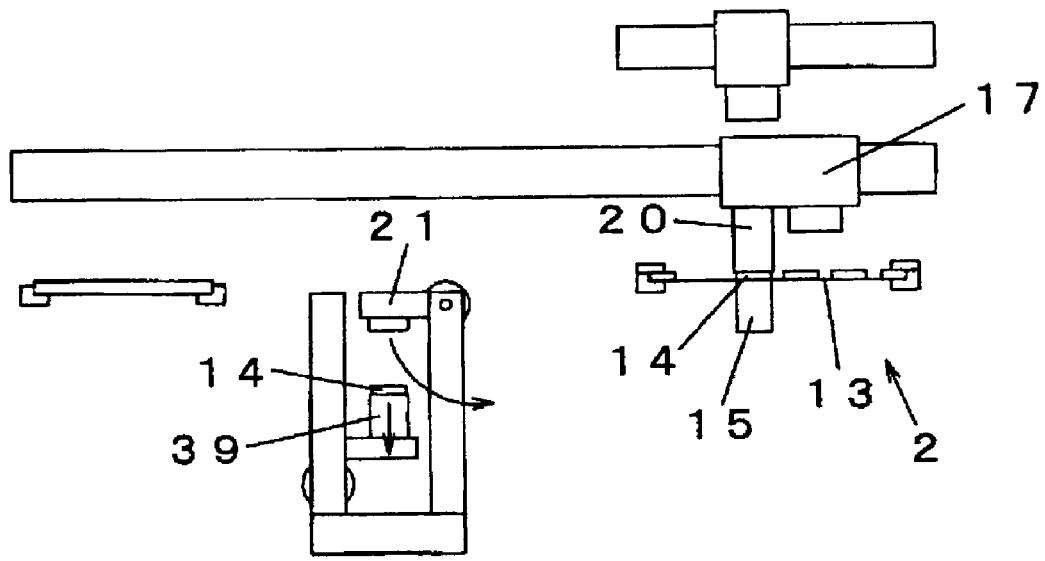
FIGS. 14A and 14B present action explaining diagrams of the chip mounting actions in Embodiment 2 of the invention.
Figure 14B:
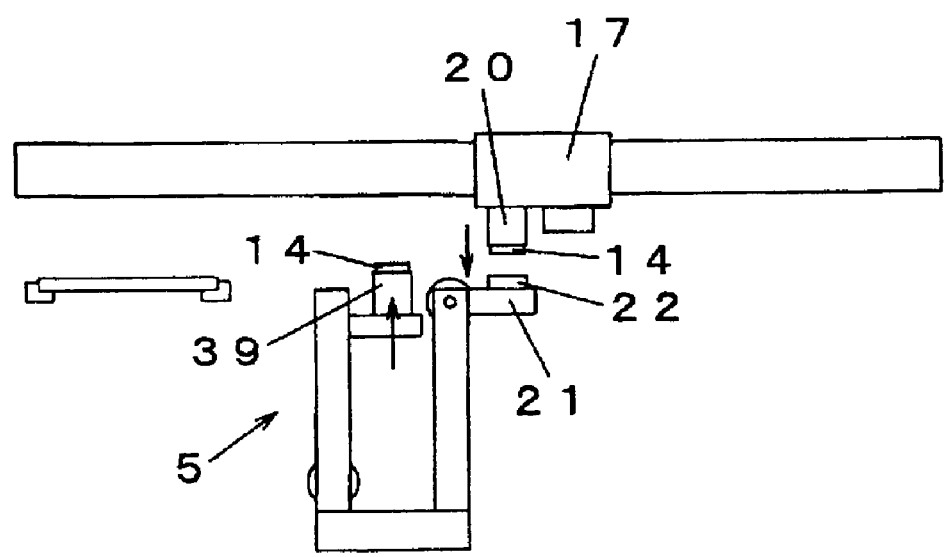

Specifically, as shown in FIG. 14A, the chip pick-up action to pick up the next chip 14 by the bonding nozzle 20 is executed at the chip feed unit 2. In the chip reversing device 5, the chip receiving unit 39 is lowered to the retracted position, and the reversing member 21 is turned downward counter-clockwise. As a result, the reversing member 21 restores the original position or the upward position. At the same time, the chip receiving unit 39 holding the chip 14 is lifted to position the chip 14 at the height level L shown in FIG. 2. Then, the bonding nozzle 20 holding the chip 14 is lowered toward the chip holding unit 22 returned to the original upward position, and the chip 14 is placed and held on the chip holding unit 22.

Figure 15A:
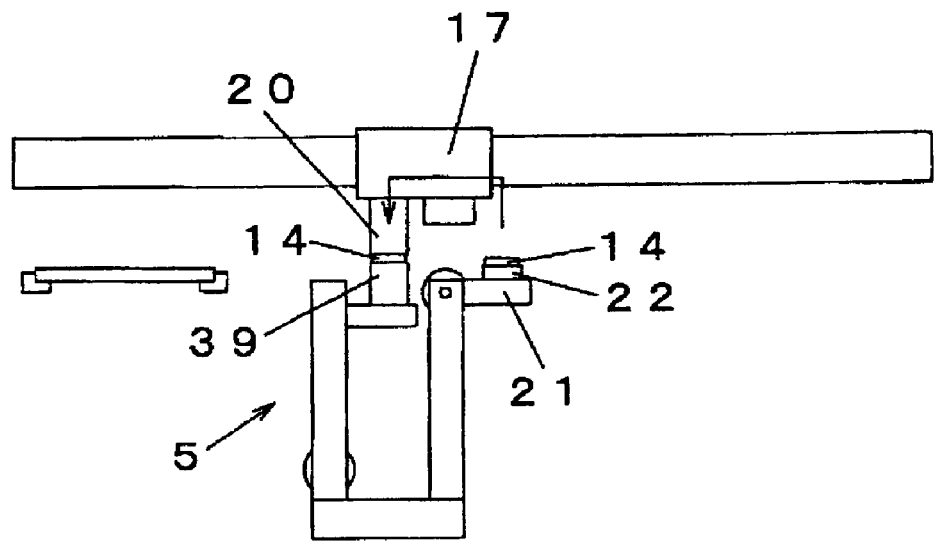
FIGS. 15A and 15B present action explaining diagrams of the chip mounting actions in Embodiment 2 of the invention.

After this, as shown in FIG. 15A, the bonding nozzle 20, which has been emptied by placing the chip 14 on the chip holding unit 22, moves upward of the chip receiving unit 39. Then, the bonding nozzle 20 is positioned and moved up and down with respect to the chip 14 held on the chip receiving unit 39 so that the chip 14 is held on and transferred to the bonding nozzle 20.

Figure 15B:
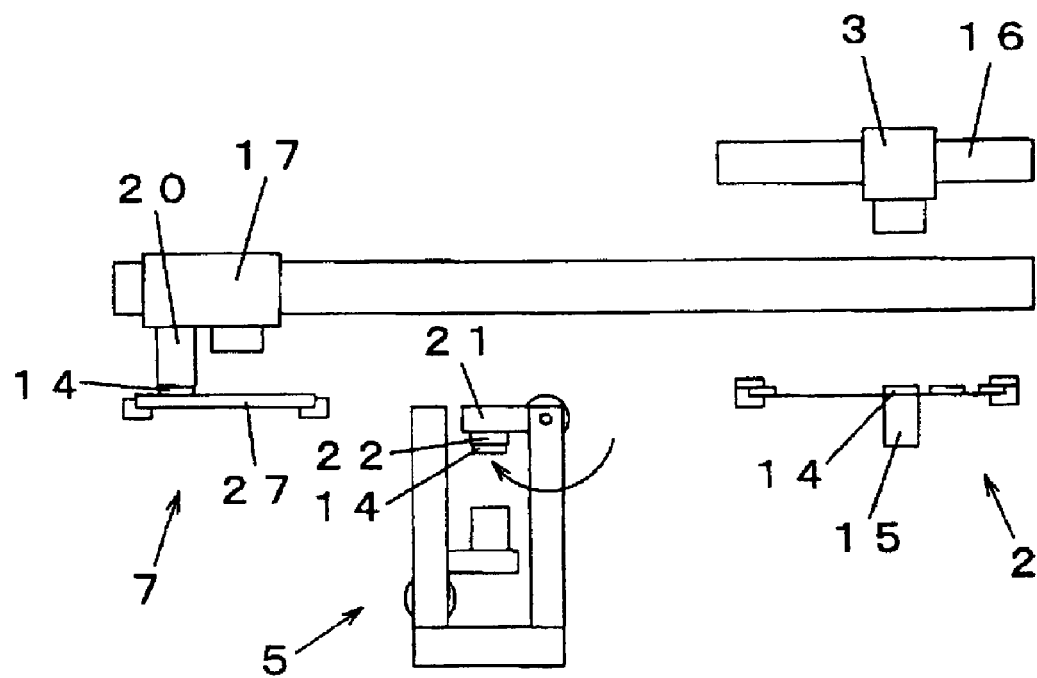

Next, the transferred chip 14 is conveyed to the flux transfer unit 6 by the chip mount unit, and the flux 24 is transferred to the chip 14. After this, the mounting step of mounting the chip 14 on the substrate 27. Specifically, the mounting head 17 having the flux-transferred chip 14 on the bonding nozzle 20 is moved to above the substrate holding unit 7. Then, the chip-mounted position of the substrate 27 is photographed for the position recognition by the substrate recognize camera 19. After this, the mounting head 17 is positioned on the basis of the position recognition result, and the chip 14 is mounted on the substrate 27, as shown in FIG. 15B.

Figure 16:
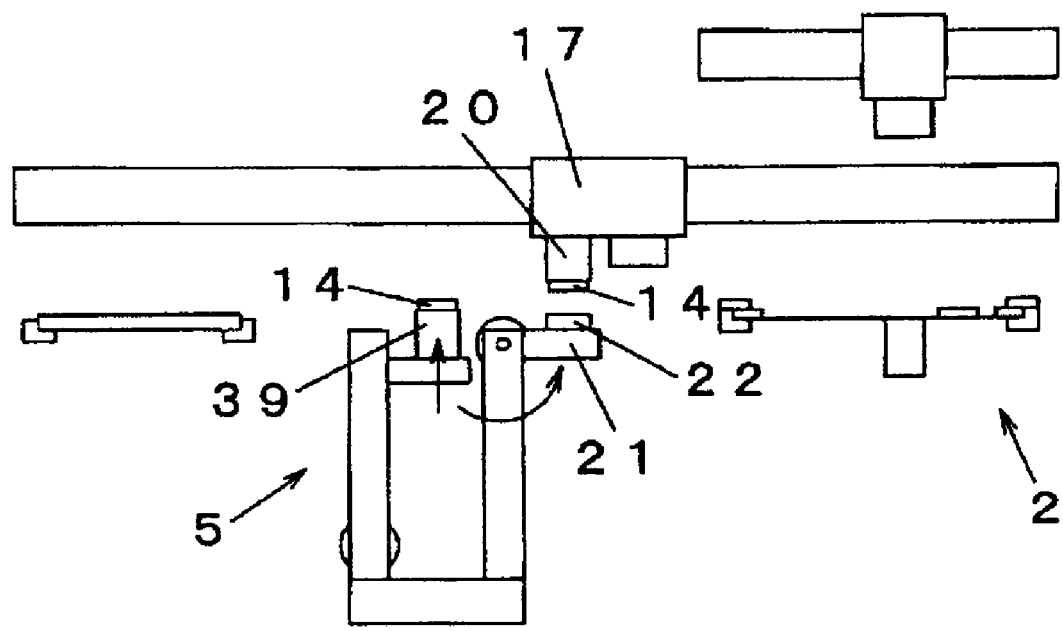
FIG. 16 present action explaining diagrams of the chip mounting actions in Embodiment 2 of the invention.

In parallel with this action, moreover, the chip reversing device 5 turns the reversing member 21 downward clockwise to change the vertical direction of the chip holding unit 22 thereby to reverse the chip 14 up-side-down. In the chip feed unit 2, on the other hand, the ejector mechanism 15 is positioned below the chip 14 to be next picked up, and the chip 14 is photographed by the chip recognize camera 3. As shown in FIG. 16, moreover, the mounting head 17 having the chip 14 held by the bonding nozzle 20 moves to the chip reversing device 5, so that the chip 14 is placed on the chip holding unit 22 having restored its upward original position.

Then, the chip receiving unit 39 holding the chip 14 rises to position the chip 14 at the height level L shown in FIG. 2. In the actions to be repeatedly executed, the actions on the preceding chip from the chip holding step to the reversing step and the actions on the succeeding chip from the chip receiving step to the mounting step are executed simultaneously in parallel, as exemplified by the actions at and after FIG. 15A.

Specifically in the chip mounting method according to this embodiment, the chip mounting actions including the chip holding step, the repeating step, the chip transferring step and the mounting step thus far described are repeatedly executed on the plural chips. In this procedure, an overlap is allowed between the execution timing on one chip from the chip transferring step to the mounting step and the execution timing on the next chip, as to be mounted subsequent to that one chip, from the chip holding step to the transferring step.

In the actions to extract and mount numerous chips of the same kind, therefore, efficient chip mounting actions can be realized by eliminating the spare time period. In the aforementioned reversing step, moreover, the chip 14 held by the chip holding units 22 is vertically reversed, as in Embodiment 1, by turning the reversing member 21 downward on the inversion axis thereby to change the vertical direction of the chip holding unit 22. As a result, the effects, as have been described in Embodiment 1, are more prominent, in case the overlap of the execution timings of the action steps are allowed, as has been described hereinbefore.

The chip mounting apparatus of the invention has an effect that the chip mounting actions can be made efficient, and is useful for the mode, in which the chip such as a flip chip having an electrode face is reversed up-side-down and then mounted on the substrate.

What is claimed is:

1. A chip reversing method for reversing a chip vertically by a chip reversing device including a reversing member on which a chip holding unit is arranged for holding said chip, and reversible vertically around a horizontal reversal shaft disposed in an end portion of said reversing member, and a chip receiving unit for receiving a chip in a downward position from said chip holding unit, comprising:

a chip holding step of placing a chip on said chip holding unit in an upward position and holding said chip from a lower side thereof;

a chip receiving unit retracting step of retracting said chip receiving unit to a retracting position in which no positional interference with said reversing member occurs;

a reversing step of vertically reversing said chip held on said chip holding unit by turning said reversing member downward on said reversal shaft to change an orientation of said chip holding unit vertically;

a chip receiving unit returning step of returning said chip receiving unit from said retracting position to a receiving position to receive said chip from said chip holding unit in a downward position; and a chip receiving step of receiving said vertically reversed chip from said chip holding unit in the downward position by said chip receiving unit.

2. The chip reversing method according to claim 1, wherein said chip receiving unit retracting step is executed before said reversing step, and said chip receiving unit returning step is executed after said reversing step.

3. The chip reversing method according to claim 1, wherein said chip receiving unit retracting step is executed by vertically lowering said chip receiving unit to said retracting position, and said chip receiving unit returning step is executed by vertically lifting up said chip receiving unit from said retracting position to said receiving position.

* * * * *